(12) United States Patent
Parkhurst et al.

(10) Patent No.: US 6,710,655 B2
(45) Date of Patent: Mar. 23, 2004

(54) BIPOLAR EMITTER COUPLE PAIR TRANSCONDUCTOR FOR HIGH SPEED OPERATIONAL AMPLIFIERS

(75) Inventors: Charles Parkhurst, Dallas, TX (US); Julio E. Acosta, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 10/144,109

(22) Filed: May 13, 2002

(65) Prior Publication Data

US 2002/0180526 A1 Dec. 5, 2002

Related U.S. Application Data

(60) Provisional application No. 60/293,074, filed on May 23, 2001.

(51) Int. Cl.[7] ................................................. H03F 3/45
(52) U.S. Cl. ...................................... 330/252; 330/257
(58) Field of Search ................................. 330/252, 257, 330/301

(56) References Cited

U.S. PATENT DOCUMENTS 5,374,897 A * 12/1994 Moraveji .................... 330/252
5,512,859 A * 4/1996 Moraveji .................... 330/257
6,278,326 B1 * 8/2001 Murray et al. ............... 330/288

* cited by examiner

*Primary Examiner*—Khanh Van Nguyen
(74) *Attorney, Agent, or Firm*—Alan K. Stewart; W. James Brady, III; Frederick J. Telecky, Jr.

(57) ABSTRACT

An emitter coupled pair transconductor circuit includes: an emitter couple pair 20 and 21; and a tail current source coupled to the emitter couple pair wherein the tail current source provides a tail current that is a hyperbolic cosine function relative to a differential input signal. This solution transforms the output current of an emitter couple pair transconductor from a hyperbolic tangent to a hyperbolic sine by using a hyperbolic cosine comparator for the biasing. By doing this, the transconductor has a similar speed behavior to a second-generation current conveyor and is more precise. This transformation makes a regular transconductor very fast without changing its parameters.

14 Claims, 3 Drawing Sheets

BIPOLAR EMITTER COUPLE PAIR TRANSCONDUCTOR FOR HIGH SPEED OPERATIONAL AMPLIFIERS

This application claims priority under 35 USC §119 (e)(1) of provisional application No. 60/293,074 filed May 23, 2001.

FIELD OF THE INVENTION

This invention generally relates to electronic systems and in particular it relates to an all bipolar emitter couple pair transconductor for high speed operational amplifiers.

BACKGROUND OF THE INVENTION

One of the most important parts in the design of operational amplifiers (opamps) is the input stage. This stage defines many characteristics that make an opamp unique when compared to others. The prior art emitter couple pair transconductor shown in FIG. 1 is the most common used input stage in opamps because it is well known and has excellent noise performance, low input offset voltage, high gain and very good common mode rejection ratio (CMRR). The circuit of FIG. 1 includes NPN bipolar transistors 20–23; PNP bipolar transistors 24 and 25; bias current Ibias; buffer 28; capacitor 30; tail current I_tail; inputs IN_POS and IN_NEG; and output OUT. Unfortunately, this input stage has poor slew rate (speed parameter) because the current available is limited by the biasing current. This is why other input stages and circuits are used in high speed applications instead of the emitter couple pair. One example is the current feedback opamp, which has a very good slew rate but poor gain, noise, CMRR and offset voltage.

The main limitation of the emitter couple pair transconductor in high speed opamps is the hyperbolic tangent (tanh) behavior of its output current. This is due to the fact that an emitter couple pair transconductor is biased in a class A mode, meaning that the output current available in signal transitions is limited to the tail current I_tail (biasing current) of the transconductor. The parameter that is directly affected by this is the slew rate, which is the measure of how fast an amplifier reacts to a very fast step signal. Slew rate in a transconductor is directly proportional to the current available (tail current I_tail) to charge the compensation capacitor 30 that is used for stability purposes. Since the current is limited, the slew rate will also be limited making this a first order limitation in a normal transconductor.

There is a way to increase the slew rate in a transconductor. Decreasing the value of the compensation capacitor does this. Unfortunately, changing this parameter alone will affect the stability of the transconductor by decreasing its phase margin. The correct way to decrease the compensation capacitor is accomplished by decreasing the transconductance of the transconductor while keeping its tail current and unity gain bandwidth fixed. This approach permits a lower value compensation capacitor while maintaining the bandwidth with good stability and higher slew rate. The well-known solution is to degenerate the emitters of the transistors in a normal transconductor. The price paid by doing this is a decrease in the open loop gain and an increase in noise therefore making the opamp less precise. In conclusion, the faster the transconductor is made the less precise it will be and vice versa.

Current feedback amplifiers are one solution to the slew rate limitation in traditional opamps. These amplifiers are very fast because they use as an input stage a second-generation current conveyor (CCII). Unlike the emitter couple pair transconductor, the CCII has unlimited output current behavior, that is, its output current has a hyperbolic sine (sinh) response to input voltages. This means that in signal transitions there will be an unlimited amount of current (in theory) to charge the compensation capacitor. In theory, slew rate in a CCII is infinite but in practice this will be limited by the internal capacitors of the transistors making this a second order effect instead of a first order effect like in the transconductor. The disadvantages of this topology are high input offset voltage, relatively low gain, low CMRR, in some topologies higher total harmonic distortion (THD), and the requirement of a feedback resistor to set the bandwidth and stability of the circuit.

SUMMARY OF THE INVENTION

An emitter coupled pair transconductor circuit includes: an emitter couple pair; and a tail current source coupled to the emitter couple pair wherein the tail current source provides a tail current that is a hyperbolic cosine function relative to a differential input signal. This solution transforms the output current of an emitter couple pair transconductor from a hyperbolic tangent to a hyperbolic sine by using a hyperbolic cosine comparator for the biasing. By doing this, the transconductor has a similar speed behavior to a second-generation current conveyor and is more precise. This transformation makes a regular transconductor very fast without changing its parameters.

DETAILED DESCRIPTION OF PREFERRED EMBODIMENTS

The preferred embodiment solution to the problem of the prior art is to transform the output current of an emitter couple pair transconductor from a hyperbolic tangent to a hyperbolic sine by using a hyperbolic cosine comparator for the biasing. By doing this, the transconductor has a similar speed behavior to a CCII and is more precise. This transformation makes a regular transconductor very fast without changing its parameters.

Figure 1:
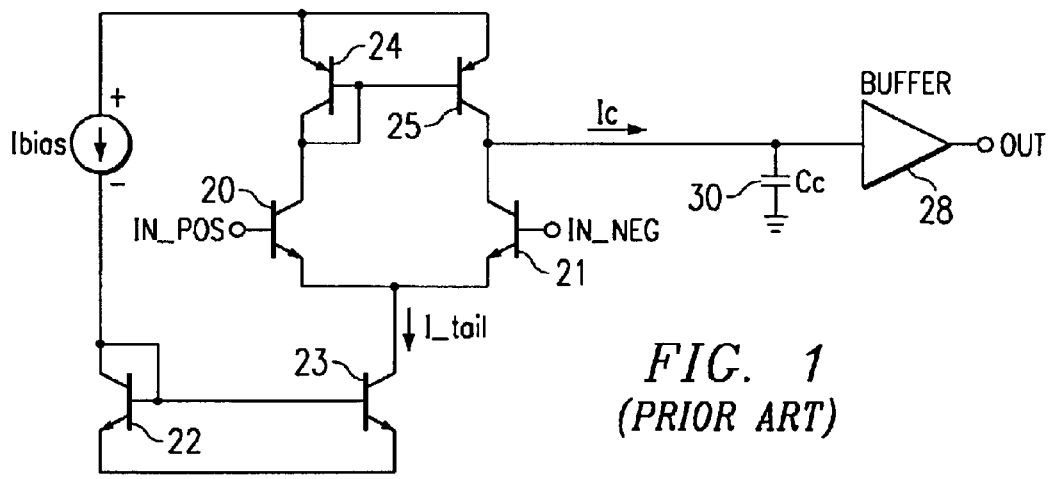
FIG. 1 is a schematic circuit diagram of a prior art emitter couple pair transconductor.

By definition, slew rate is the rate of change of the output voltage of the circuit with respect to time when a step signal is applied to the circuit. The equation that describes slew rate (SR) on the prior art circuit in FIG. 1 is:

$$SR = \frac{dV_{out}}{dt} = \frac{I_c}{C_c} \quad (1)$$

where $C_c$ is the compensation capacitor and $I_c$ is the tail current I_tail (collector current in transistor 23) in the transconductor. Since the circuit in FIG. 1 is assumed to be a two pole amplifier with a phase margin of 45°, the compensation capacitor 30 can be defined by:

$$C_c = \frac{gm}{2\pi f} \qquad (2)$$

where f is the frequency at unit gain of a phase margin of 45° and gm is the transconductance. This transconductance can be defined in terms of transistor parameters with the assumption of a small signal operation at a very low frequency (refer to equation 3):

$$gm = \frac{I_c}{2*V_T} \qquad (3)$$

where $V_T$ is the thermal voltage of a bipolar transistor and $I_c$ is the output current of the transconductor. Increasing $I_c$ in equation 3 will mean that gm increases, which in turn will increase the required capacitance $C_c$ (to keep bandwidth constant) by the same amount, keeping the end SR constant. Traditionally, to increase SR the only parameter that can be adjusted is the transconductance by using emitter degeneration in transistors 20 and 21. This will result in a lower transconductance gm, which translates into a smaller capacitance $C_c$ for the same bandwidth and current $I_c$. Degenerating transistors 20 and 21 will increase the SR but it will decrease the open loop gain of the amplifier ($A_{vo}$=gm*$R_{out}$), where $R_{out}$ is the output resistance, and will also increase noise.

Figure 2:
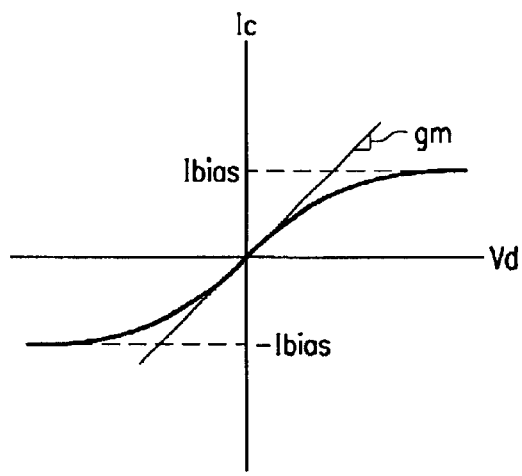
FIG. 2 is a plot of current Ic in the circuit of FIG. 1.

The output current Ic of the circuit in FIG. 1 is given by:

$$I_C = I_{bias} * \tanh\left(\frac{V_d}{2V_T}\right) \qquad (4)$$

where $V_d$ is the differential voltage between nodes IN__POS and IN__NEG and current $I_{bias}$ is the tail current provided by transistor 23. For simplicity's sake, equation 4 is neglecting errors due to β and early voltage. In the plot of equation 4, shown in FIG. 2, the current Ic has a linear slope in a small range of $V_d$. This linear part of the plot gives the small signal transconductance gm of the amplifier that sets the open loop gain of the amplifier. When $V_d$ increases the current $I_c$ gets closer and tangent to current $I_{bias}$. This is exactly the limitation in SR of an emitter couple pair because there is only a maximum amount of current available to charge capacitor $C_c$ in a step signal transition. It is worth noting that the small signal model of the transistors is no longer valid when $V_d$ is outside the linear part of the plot meaning that equation 3 is no longer true and no conclusions can be made using this equation.

The preferred embodiment solution to this problem is to make current $I_c$ a function of $V_d$ such that when $|V_d|$ increases, $I_c$ will also increase. This allows (in theory) infinite SR in a transconductor without changing its small signal transconductance and bandwidth (small signal wise). This change is intended to only affect the behavior of the circuit in its non-linear part. Mathematically, a simple multiplication of a hyperbolic tangent by a hyperbolic cosine (cosh) will solve the problem.

Figure 3:
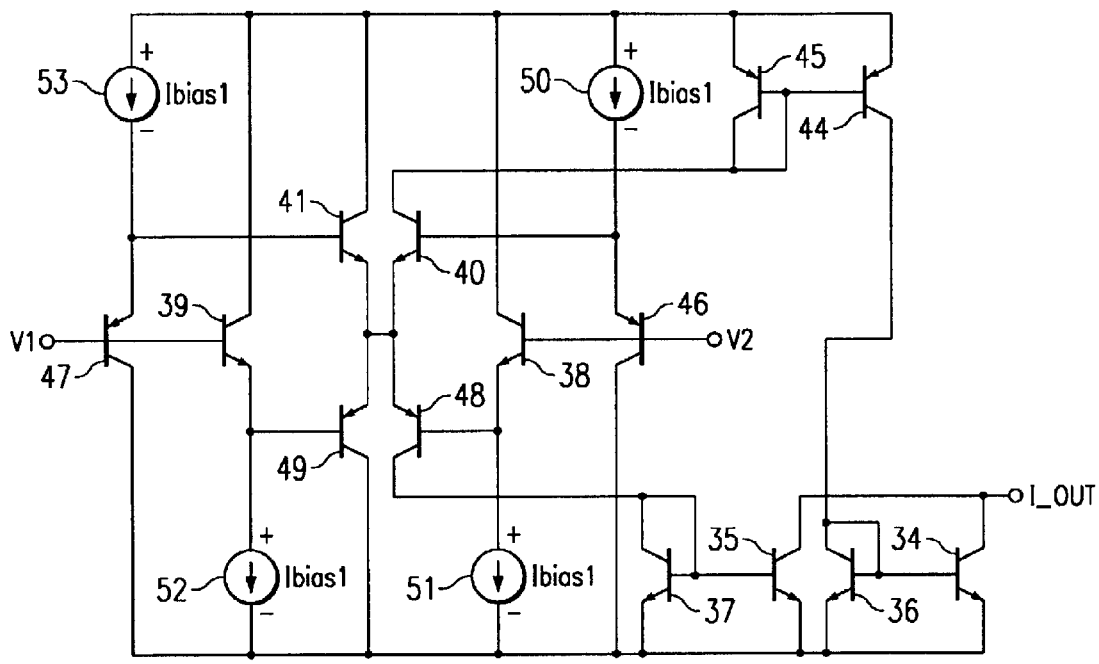
FIG. 3 is a schematic circuit diagram of a preferred embodiment circuit that provides an output current with a hyperbolic cosine function.

FIG. 3 shows the preferred embodiment circuit that realizes a cosh like function. The circuit of FIG. 3 includes NPN bipolar transistors 34–41; PNP bipolar transistors 44–49; current sources 50–53; bias current $I_{bias1}$; input nodes V1 and V2; and output current I__OUT. Transistors 39, 41, 47, and 49 form a translinear loop. Transistors 38, 40, 46, and 48 form a translinear loop. Transistors 45, 44, 36, and 34 mirror the current from transistor 40 to the output node I__OUT. Transistors 37 and 35 mirror the current from transistor 48 to the output node I__out. This circuit compares the input voltages in each of its nodes and provides only extra sinking current ($I_{out}$) in the falling and rising edges of an input signal. When the difference between its input nodes V1 and V2 is zero the circuit outputs a constant current value that is twice $I_{bias1}$. Basically the circuit implements a voltage controlled current source with the ability to only sink current.

A close examination to the output current I__OUT vs. the differential voltage ($V_d$) in the circuit of FIG. 3 will give the following mathematical approximation:

$$I_{out} \approx 2 * I_{bias1} \cosh\left(\frac{V_d}{V_T}\right) \qquad (5)$$

In order to combine equations 4 and 5, equation 5 needs to be put in terms of the biasing current $I_{bias}$ but first:

$$I_{bias1} = \frac{I_{bias}}{2} \qquad (6)$$

Now by combining equations 5 and 6 we will have:

$$I_{out} \approx I_{bias} \cosh\left(\frac{V_d}{V_T}\right) \qquad (7)$$

Figure 4:
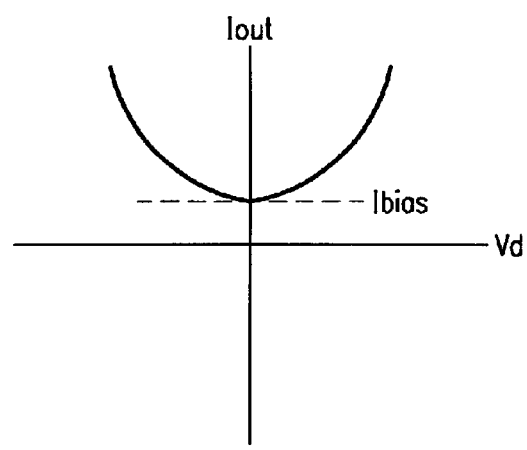
FIG. 4 is a plot of the output current for the circuit of FIG. 3.

By plotting equation 7, as shown in FIG. 4, it is shown that the output current $I_{out}$ increases when $V_d$ goes positive or negative but, when $V_d$ is zero, current $I_{out}$ will be two times $I_{bias1}$ making the circuit operate in a class AB mode.

Figure 5:
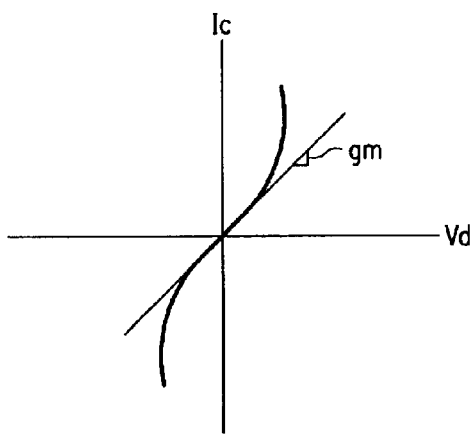
FIG. 5 is a plot of current Ic in the circuit of FIG. 6.

Equation 7 can be combined with equation 4 in order to obtain:

$$I_c \approx I_{bias} \cosh\left(\frac{V_d}{V_T}\right) * \tanh\left(\frac{V_d}{2V_T}\right) \qquad (8)$$

which can be approximated numerically to a hyperbolic sine like function, as shown in FIG. 5. It can be noted from equation 8, as shown in FIG. 5, that the slope of the graph in its linear part is the same as in FIG. 2. This means that the small signal transconductance gm is the same for both circuits. The only change is that now the current is not limited to the tail current when the transconductor is operating outside its linear part, instead it is going infinite when $V_d$ increases. The implementation of this function is to combine an emitter couple pair transconductor with the circuit shown in FIG. 3.

Figure 6:
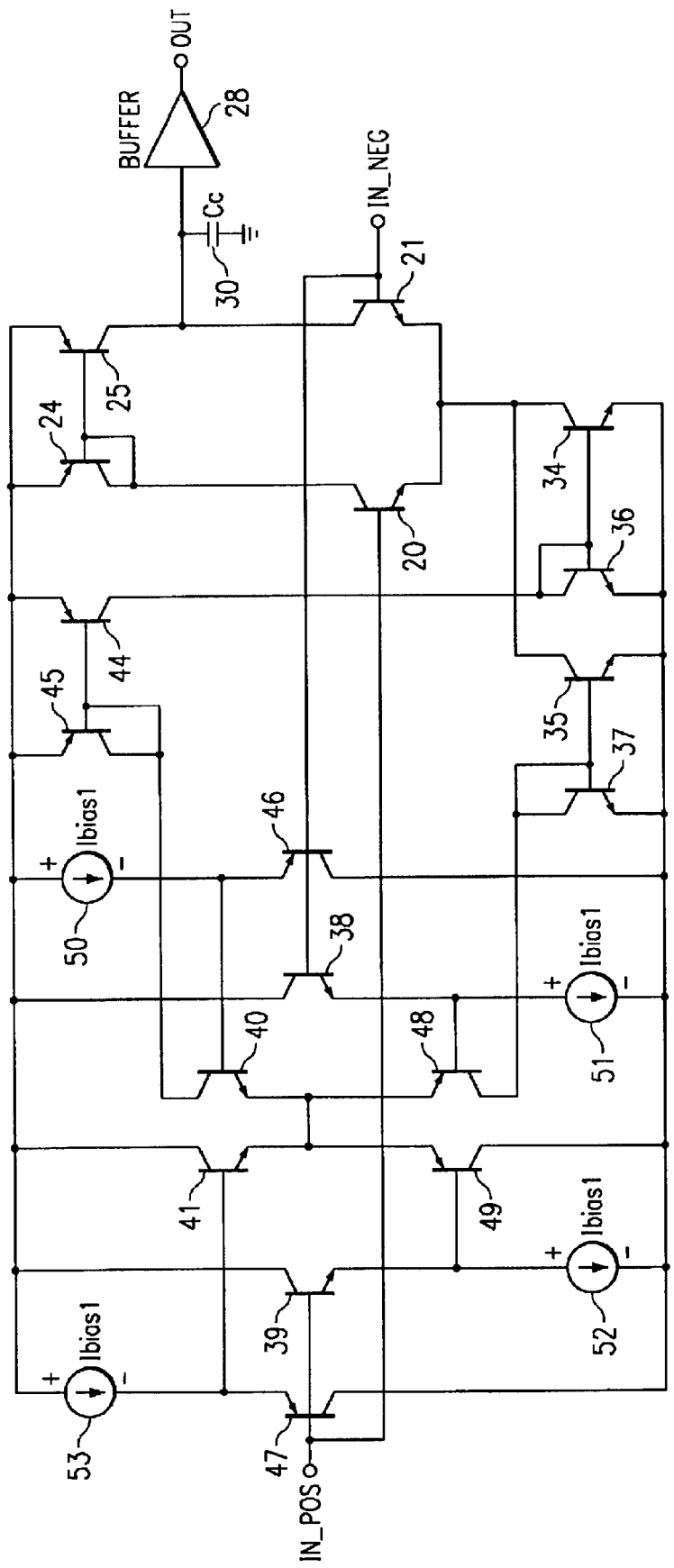
FIG. 6 is a schematic circuit diagram of the preferred embodiment circuit of FIG. 3 coupled to an emitter couple pair circuit.

This combination results in a dynamically biased emitter couple pair transconductor operating on a class AB mode, as shown in FIG. 6. The circuit of FIG. 6 includes the circuit of FIG. 3 with the addition of an emitter couple pair circuit as shown in FIG. 1. In this circuit the $I_c$ current that is available to charge the capacitor $C_c$ has a symmetric path avoiding any delays or asymmetries in the transient response of the circuit. The circuit of FIG. 6 takes a regular emitter couple pair transconductor and biases it dynamically, such that the output current available to charge the compensation capacitor is unlimited making the transconductor behave as a CCII. This provides the transconductor with very high slew rate while keeping fixed its open loop gain, bandwidth, input offset voltage, voltage noise and CMRR.

The preferred embodiment solution improves the regular emitter couple pair transconductor by providing extra current to charge the compensation capacitor during a voltage transition (non-linear operation) making SR higher. It does this without affecting the small signal transconductance gm of the transconductor and the compensation capacitor $C_c$, therefore keeping parameters such as open loop gain, bandwidth, phase margin and CMRR the same. There are other parameters that remain the same such as input offset voltage, input voltage noise and THD which are desirable in many applications.

Other solutions always affect parameters like open loop gain, bandwidth, CMRR, input offset voltage, voltage noise and THD in order to have higher slew rate in an operational amplifier. The preferred embodiment solution makes an emitter couple pair transconductor (input stage of an operational amplifier) very fast by increasing its slew rate without affecting most of its desirable parameters. At the end this results in a very fast and precise operation amplifier with high slew rate while keeping an excellent performance in open loop gain, bandwidth, CMRR, voltage noise, input offset voltage, THD, and there is no need for a feedback resistor in unity gain configurations.

While this invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
    an emitter couple pair; and
    a tail current source coupled to the emitter couple pair wherein the tail current source comprises:
        a first translinear loop having a first differential input node;
        a second translinear loop coupled to the first translinear loop and having a second differential input node, and first and second output nodes;
        a first current mirror coupled to the first output node;
        a second current mirror coupled between the first current mirror and a current output node; and
        a third current mirror coupled between the second output node and the current output node.

2. The circuit of claim 1 wherein the first translinear loop comprises:
    a first bipolar transistor having a base coupled to the first differential input node;
    a second bipolar transistor coupled to a common node and having a base coupled to the first bipolar transistor;
    a third bipolar transistor having a base coupled to the first differential input node; and
    a fourth bipolar transistor coupled to the common node and having a base coupled to the third bipolar transistor.

3. The circuit of claim 2 wherein the second translinear loop comprises:
    a fifth bipolar transistor having a base coupled to the second differential input node;
    a sixth bipolar transistor coupled between the first output node and the common node, and having a base coupled to the fifth bipolar transistor;
    a seventh bipolar transistor having a base coupled to the second differential input node; and
    an eighth bipolar transistor coupled between the second output node and the common node, and having a base coupled to the seventh bipolar transistor.

4. The circuit of claim 3 further comprising:
    a first current source coupled to the first bipolar transistor;
    a second current source coupled to the third bipolar transistor;
    a third current source coupled to the fifth bipolar transistor; and
    a fourth current source coupled to the seventh bipolar transistor.

5. The circuit of claim 3 wherein the first, fourth, fifth, and eighth bipolar transistors are PNP transistors, and the second, third, sixth, and seventh bipolar transistors are NPN transistors.

6. The circuit of claim 1 wherein the emitter couple pair Comprises:
    a first bipolar transistor having a base coupled to a first differential input node and an emitter coupled to the tail current source; and
    a second bipolar transistor having an emitter coupled to the tail current source and a base coupled to a second differential input node.

7. The circuit of claim 6 wherein the first and second bipolar transistors are NPN transistors.

8. The circuit of claim 6 further comprising a compensation capacitor coupled to the second bipolar transistor.

9. The circuit of claim 1 wherein an output current of the emitter couple pair is a hyperbolic sine function.

10. A current source comprising:
    a first translinear loop having a first differential input node;
    a second translinear loop coupled to the first translinear loop and having a second differential input node, and first and second output nodes;
    a first current mirror coupled to the first output node;
    a second current mirror coupled between the first current mirror and a current output node; and
    a third current mirror coupled between the second output node and the current output node.

11. The circuit of claim 10 wherein the first translinear loop comprises:
    a first bipolar transistor having a base coupled to the first differential input node;
    a second bipolar transistor coupled to a common node and having a base coupled to the first bipolar transistor;
    a third bipolar transistor having a base coupled to the first differential input node; and
    a fourth bipolar transistor coupled to the common node and having a base coupled to the third bipolar transistor.

12. The circuit of claim 11 wherein the second translinear loop comprises:
    a fifth bipolar transistor having a base coupled to the second differential input node;
    a sixth bipolar transistor coupled between the first output node and the common node, and having a base coupled to the fifth bipolar transistor;
    a seventh bipolar transistor having a base coupled to the second differential input node; and
    an eighth bipolar transistor coupled between the second output node and the common node, and having a base coupled to the seventh bipolar transistor.

13. The circuit of claim 12 further comprising:
    a first current source coupled to the first bipolar transistor;
    a second current source coupled to the third bipolar transistor;
    a third current source coupled to the fifth bipolar transistor; and
    a fourth current source coupled to the seventh bipolar transistor.

14. The circuit of claim 12 wherein the first, fourth, fifth, and eighth bipolar transistors are PNP transistors, and the second, third, sixth, and seventh bipolar transistors are NPN transistors.

* * * * *